(12) United States Patent
Chen et al.

(10) Patent No.: US 12,476,230 B2
(45) Date of Patent: Nov. 18, 2025

(54) EMBEDDED PACKAGING STRUCTURE AND METHOD FOR MANUFACTURING THE SAME

(71) Applicant: Zhuhai ACCESS Semiconductor Co., Ltd., Guangdong (CN)

(72) Inventors: Xianming Chen, Guangdong (CN); Benxia Huang, Guangdong (CN); Lei Feng, Guangdong (CN); Lina Jiang, Guangdong (CN); Bingsen Xie, Guangdong (CN); Jindong Feng, Guangdong (CN)

(73) Assignee: ZHUHAI ACCESS SEMICONDUCTOR CO., LTD, Guangdong (CN)

( * ) Notice: Subject to any disclaimer, the term of this patent is extended or adjusted under 35 U.S.C. 154(b) by 555 days.

(21) Appl. No.: 17/393,486

(22) Filed: Aug. 4, 2021

(65) Prior Publication Data
US 2022/0045043 A1 Feb. 10, 2022

(30) Foreign Application Priority Data

Aug. 5, 2020 (CN) .................... CN202010778619.0

(51) Int. Cl.
| | |
|---|---|
| *H01L 25/075* | (2006.01) |
| *H01L 21/48* | (2006.01) |
| *H01L 21/56* | (2006.01) |
| *H01L 23/367* | (2006.01) |
| *H01L 23/498* | (2006.01) |
| *H01L 25/16* | (2023.01) |
| *H01L 29/24* | (2006.01) |

(52) U.S. Cl.
CPC ........ *H01L 25/167* (2013.01); *H01L 21/4857* (2013.01); *H01L 21/563* (2013.01); *H01L 23/367* (2013.01); *H01L 23/49822* (2013.01); *H01L 25/165* (2013.01)

(58) Field of Classification Search
CPC .............. H01L 25/167; H01L 23/5389; H01L 23/3736; H01L 23/367; H01L 23/552; H01L 2224/18–255; H01L 2224/82002; H01L 2224/82106; H01L 33/486; H01L 33/58; H01L 33/64–648; H01L 31/024; H01L 31/02164; H01L 31/0203; H01L 21/568; H01L 25/041; H01L 25/042; H01L 25/075; H01L 25/0753; H10H 29/20; H10H 29/24
See application file for complete search history.

(56) References Cited

U.S. PATENT DOCUMENTS

| | | | |
|---|---|---|---|
| 2012/0217607 A1* | 8/2012 | Hanai | H01L 27/1469 438/66 |
| 2016/0284920 A1* | 9/2016 | Saugier | H01L 31/0203 |
| 2017/0213793 A1* | 7/2017 | Hurwitz | H01L 23/5389 |

(Continued)

*Primary Examiner* — Yu Chen
(74) *Attorney, Agent, or Firm* — The PL Law Group, PLLC

(57) ABSTRACT

An embedded packaging structure according to an embodiment of the present disclosure includes an optical communication device embedded in a substrate, and a blocking wall surrounding the working face opening. The optical communication device may include a working face for emitting light or receiving light. The working face may be revealed by a working face opening from a first surface of the substrate. The blocking wall may extend beyond the first surface in a direction away from the first surface.

7 Claims, 6 Drawing Sheets

(56) References Cited

U.S. PATENT DOCUMENTS

| | | | |
|---|---|---|---|
| 2018/0182913 A1* | 6/2018 | Chen | G01S 17/04 |
| 2019/0157108 A1* | 5/2019 | Liao | H01L 21/486 |
| 2019/0311916 A1* | 10/2019 | Chavali | H01L 23/5389 |
| 2020/0105638 A1* | 4/2020 | Chiang | H01L 21/561 |
| 2021/0090908 A1* | 3/2021 | Renjan | H01L 24/48 |

* cited by examiner

EMBEDDED PACKAGING STRUCTURE AND METHOD FOR MANUFACTURING THE SAME

CROSS-REFERENCE TO RELATED APPLICATION

This application claims the benefit under 35 USC § 119(a) of China Patent Application No. 202010778619.0, filed on Aug. 5, 2020, in the China Intellectual Property Office, the entire disclosure of which is incorporated herein by reference for all purposes.

BACKGROUND

1. Technical Field

The embodiments of the present invention relate to the technical field of substrate packaging, and specifically to an embedded packaging structure and its manufacturing method.

2. Background of the Invention

With the development of the electronics industry, the electronic products tend to become highly integrated, multiple functional, having high performance, and miniaturized. Therefore, the embedded packaging substrate, which can provide arrangement for multiple devices, is gradually taking the dominant position. In the embedded packaging substrate, the metal wire rods are generally used as a transmission medium for data signals. However, the metal wire rods have several limitations. For example, the metal wire rods have a limited electrical conduction property depending on the influence of the material and it is difficult to improve the signal transmission speed by improvement of electrical conductivity; the metal wire rods are easily affected by the external and mutual electromagnetic interference during signal transmission, especially obvious during high frequency transmission, and thus additional shielding measures is necessary which make the circuit design thereof quite difficult; and in addition, the metal wire rods transmit analogue signals which should be transformed for digital processing, prone to cause distortion.

In order to improve the various limitations of the metal wire rods as above, a manner of signal transmission using optical signals, instead of electrical signals, is developed. The most significant effect thereof is that the optical signals can hardly be affected by the electromagnetic interference, thus the signal transmission quality can be improved and the signal transmission distortion can be reduced. In addition, the design of electromagnetic shielding structure may be reduced. Therefore, the optical signal transmission manner has been a direction for future development, and it is a necessary selection to embed optical communication devices into a packaging to achieve the miniaturization and integration thereof.

In a prior packaging for optical communication devices, it is generally necessary to provide an optical path or a transparent layer formed by a transparent material onto the working face of the optical communication device, i.e., the light emitting face or the light receiving face, to prevent the working face from external or mutual interference.

However, there are following technical problems in the prior art: (1) it is necessary to implant an optical path or a transparent layer, and the requirement for the level and angle of the optical path is very high, resulting in difficulties in processing, a decreased yield rate and an increased cost; (2) the communication between different optical communication devices cannot be achieved within a single packaging; and (3) the optical communication device has a relatively small heat dissipation area and is limited in heat dissipation.

SUMMARY

In view of this, one of the objectives of the embodiments of the present application is to provide The embodiments of the present invention involve providing a solution for an embedded packaging structure and its manufacturing method, to solve the above technical problem(s) in the prior art.

With respect to the above objective, in a first aspect, in an embodiment of the present application, an embedded packaging structure is provided, including:

an optical communication device embedded in a substrate, wherein the optical communication device includes a working face for emitting light or receiving light, the working face is revealed by a working face opening from a first surface of the substrate; and a blocking wall surrounding the working face opening, wherein the blocking wall extends beyond the first surface in a direction away from the first surface.

In an embodiment, the substrate includes an insulating layer formed by a dielectric packaging material, and first and second wiring layers on the insulating layer, wherein the first wiring layer is placed on the first surface of the substrate and the second wiring layer is placed on a second surface of the substrate opposite to the first surface.

In an embodiment, the first and second wiring layers may be electrically connected by a metal via-column passing through the insulating layer.

In an embodiment, the packaging structure may be embedded with at least two of the optical communication devices. Preferably, the working faces of the at least two optical communication devices are in the same direction. Alternatively, the working faces of the at least two optical communication devices may be in the different or contrary directions.

In an embodiment, the substrate is formed therein with a device surrounding wall surrounding the optical communication device. Preferably, the device surrounding wall includes a metal material, preferably Cu.

In an embodiment, a metal heat dissipation layer is formed on a device back face of the optical communication device opposite to the working face. Preferably, the metal heat dissipation layer and the device surrounding wall are connected by the second wiring layer.

In an embodiment, the blocking wall includes a photosensitive resin material or a metal material. The photosensitive resin material preferably includes a polyimide photosensitive resin or a polyphenylene oxide/ether photosensitive resin. The metal material preferably includes Cu.

In some embodiments, the substrate further includes an additional layer building up structure formed on the first wiring layer and/or the second wiring layer. Preferably, the substrate may be formed as a structure with multiple layers interconnected.

In a second aspect, in an embodiment of the present application, a manufacturing method for an embedded packaging structure is provided, including the following steps: A) preparing a substrate including a dielectric frame, wherein the substrate includes a through hollow cavity surrounded by the frame and a metal via-column passing through a height of the frame;

B) placing a first surface of the substrate onto a bearing part;

C) placing an optical communication device into the hollow cavity of the substrate, wherein the optical communication device has a working face surface-mounted onto the bearing part;

D) laminating or coating a dielectric packaging material onto a second surface of the substrate opposite to the first surface to form an insulating layer such that the dielectric packaging material fully fills a space between the optical communication device and the frame;

E) thinning the insulating layer to reveal an end face of the metal via-column on the second surface;

F) removing the bearing part to reveal the working face of the optical communication device and the end face of the metal via-column on the first surface;

G) forming first and second wiring layers on the first and second surfaces of the substrate, wherein the first wiring layer is formed thereon with a working face opening to reveal the working face of the optical communication device from the first surface; and H) forming a blocking wall, surrounding the working face opening of the working face of the optical communication device, on the first surface of the substrate, wherein the blocking wall extends beyond the first surface in a direction away from the first surface.

Preferably, the step A further includes forming a device surrounding wall, surrounding the hollow cavity, in the dielectric frame. Preferably, the device surrounding wall includes a metal, preferably Cu.

Preferably, the bearing part is selected from a thermo-decomposing or photo-decomposing adhesive tape, a sacrificing Cu foil, a glass carrying plate or a Cu clad laminate coated on its surface with a thermo-decomposing or photo-decomposing adhesive layer.

In some embodiments, the dielectric packaging material is selected from an organic dielectric material or an inorganic dielectric material, and preferably, it is selected from one or more of prepreg (PP), bismaleimide/triazine (BT) resin, Ajinomoto buildup film (ABF), epoxy resin, and the combinations thereof.

In an embodiment, the step G further includes: applying a first seed layer on the first surface of the substrate; depositing a metal layer on the first seed layer; applying a photoresist on the metal layer, and performing exposure and development to form an etching resisting layer; and performing etching to the metal layer and the first seed layer, removing the etching resisting layer, and forming the first wiring layer and the working face opening.

In another embodiment, the step G further includes: revealing a back face of the optical communication device on the second surface of the substrate; applying a second seed layer on the second surface of the substrate; applying a photoresist on the second seed layer, and performing exposure and development to form a first pattern; and plating a metal in the first pattern and forming a second wiring layer and a metal heat dissipation layer.

Preferably, the manufacturing method includes after forming the first and second wiring layers, forming welding resisting layers on the first and second wiring layers.

In an embodiment, the step G further includes: revealing a back face of the optical communication device on the second surface of the substrate;
applying a second seed layer on the second surface of the substrate;
applying a photoresist on the second seed layer, and performing exposure and development to form a first pattern; and
plating a metal in the first pattern and forming a second wiring layer and a metal heat dissipation layer, wherein the metal heat dissipation layer is connected, by the second wiring layer, with the device surrounding wall.

In an embodiment, the step H further includes:
applying a photosensitive resin material onto the first surface of the substrate; and performing exposure, development and curing to form the blocking wall surrounding the working face opening.

In another embodiment, the step H further includes:
obtaining a prefabricated metal blocking wall;
printing a welding material in a predetermined position of the first surface of the substrate;
surface-mounting the metal blocking wall onto the welding material; and forming the blocking wall by reflow welding.

In a further embodiment, the step H further includes:
depositing a third seed layer on the first surface of the substrate;
applying a photoresist on the third seed layer, and performing exposure and development to form a second pattern;
plating a metal in the second pattern to form the blocking wall; and
removing the photoresist and performing etching to the third seed layer.

BRIEF DESCRIPTION OF THE DRAWINGS

In order to illustrate the embodiments of the present application and the technical solution(s) in the prior art more clearly, the figures necessary for use in the description of the embodiments or the prior art will be briefly introduced hereinafter. Obviously, the figures in the following description only show the embodiments of the present application. For those skilled in the art, other figures can be obtained based on these figures without any inventive work.

DETAILED DESCRIPTION

In order to make the objectives, features and advantages of the embodiments of the present application clearer and more understandable, the technical solutions in the embodiments of the present application will be described hereinafter clearly and completely in connection with the accompanying drawings. Obviously, the described embodiments are only some embodiments of the present application, rather than all embodiments. Based on the embodiments in the present application, those skilled in the art can obtain other embodiments, without any inventive work, which will all fall within the protection scope of the present application.

Figure 1:
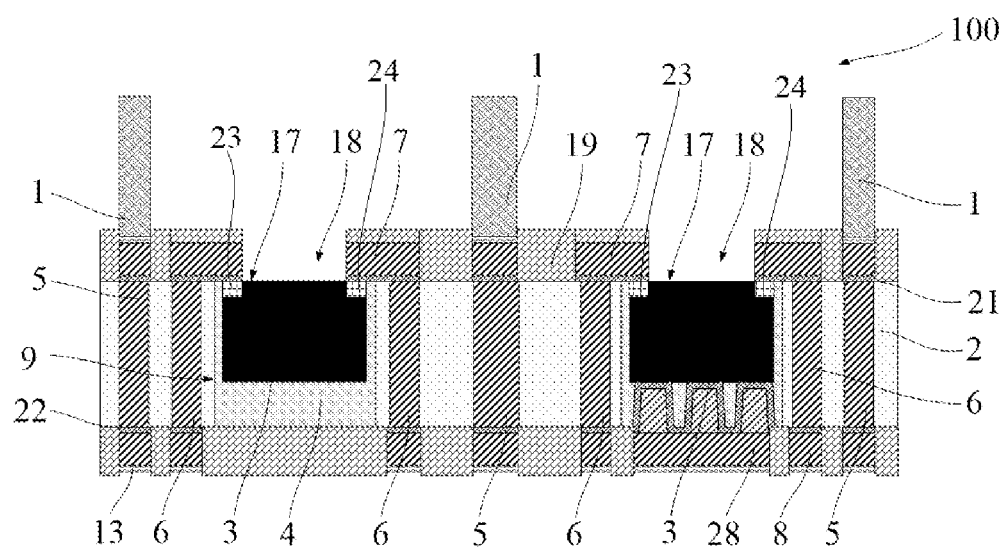
FIG. 1 is a section view of an embedded packaging structure as provided in an embodiment of the present application.
Figure 2:
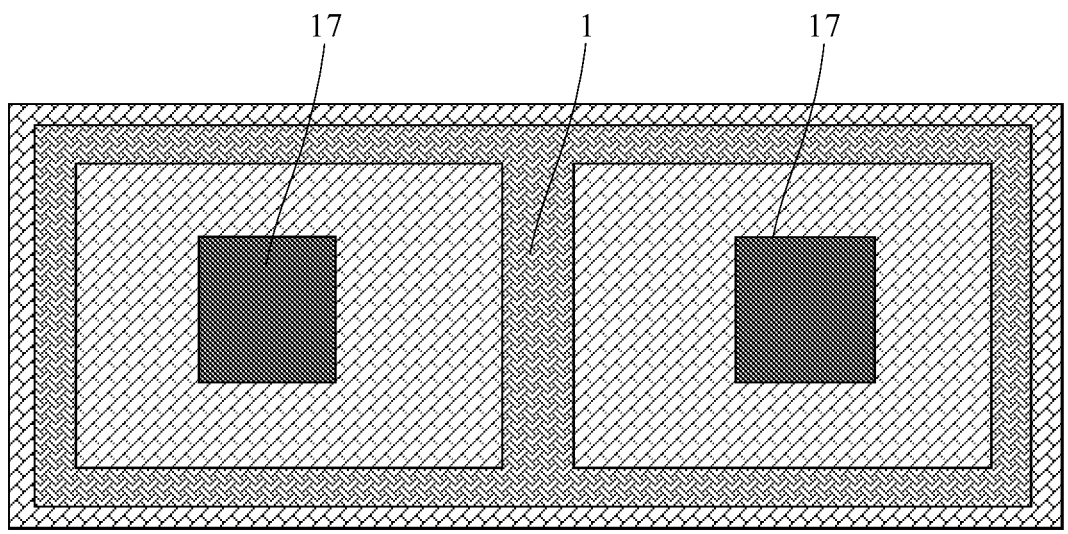
FIG. 2 is a top view of the embedded packaging structure shown in FIG. 1.

FIG. 1 is a section view of an embedded packaging structure as provided in an embodiment of the present application. FIG. 2 is a top view of the embedded packaging structure shown in figure. As shown in the figure(s), the embedded packaging structure 100 includes: an optical communication device 3 embedded in a substrate 2, wherein the optical communication device 3 includes a working face 17 for emitting light or receiving light, the working face 17 is revealed by a working face opening 18 from a first surface 21 of the substrate 2; and a blocking wall 1 surrounding the working face opening 18, wherein the blocking wall 1 extends beyond the first surface 21 in a direction away from the first surface 21.

As shown in FIG. 1, the substrate 2 includes an insulating layer 4 formed by a dielectric material, and first and second wiring layers 7 and 8 on the insulating layer 4, wherein the first wiring layer 7 is placed on the first surface 21 of the substrate 2 and the second wiring layer 8 is placed on a second surface 22 of the substrate 2 opposite to the first surface 21. The first and second wiring layers 7 and 8 may be electrically connected by a metal via-column 6 passing through the insulating layer 4. The metal via-column 6 may be a Cu column or an Al column. The wiring layers may be connected with conductive terminals 23 and 24 of the device 3, thus achieving a fan-out configuration.

The substrate 2 may be a frameless and coreless substrate, with the optical communication device 3 embedded in the insulating layer 4, or may use a dielectric frame having a hollow cavity as an initial substrate wherein the hollow cavity is embedded with the optical communication device 3 and is filled with a dielectric packaging material to form the insulating layer 4. The packaging material may use an organic dielectric material, same as or different from that of the substrate 2, such as polyimide, epoxy resin, bismaleimide/triazine (BT) resin, polyphenylene oxide/ether, Ajinomoto buildup film (ABF), green oil, PID (Photosensitive Insulating Dielectric), etc., or may be an inorganic dielectric material. If the material same as that of the substrate 2 is used as the packaging material, the insulating layer 4 can be formed by the same material, preventing the substrate 2 from separation.

At least two optical communication devices 3 can be embedded in the substrate 2 simultaneously. FIGS. 1 and 2 show that two optical communication devices 3 are embedded. However, the embodiments of the present application are not limited thereto. The number and type of the communication devices 3 may be determined according to the function(s) of the embedded packaging structure.

The substrate 2 is generally in a planar structure, and has opposite first and second surfaces 21 and 22. The working faces 17 of the at least two optical communication devices 3 may be in the same direction or in the contrary directions. For example, the working faces 17 of the two optical communication devices 3 are in the same direction, both facing the first surface 21. However, it is also possible to configure that the working face 17 of one optical communication device 3 faces the first surface 21 while the working face 17 of the other optical communication device 3 faces the second surface 22.

In the substrate 2, it is possible to form a device surrounding wall 5 surrounding the optical communication device 3 and passing through the substrate 2, as shown in FIG. 1. Alternatively, it is also possible to not provide the device surrounding wall 5 in the substrate 2. The device surrounding wall 5 may surround one optical communication device 3, or may surround multiple optical communication devices 3. The device surrounding wall 5 can function for electromagnetic shielding, and can effectively prevent the shielded device from electromagnetic interference.

As shown in the figure(s), a metal heat dissipation layer 28 may be formed on a device back face of the optical communication device 3 opposite to the working face 17, to help heat dissipation from the back face of the device. The metal heat dissipation layer 28 and the device surrounding wall 5 may be connected by the second wiring layer 8. When there are multiple optical communication devices 3 having their working faces in different directions, the metal heat dissipation layer 28 on the first surface 21 may be connected with the device surrounding wall 5 by the first wiring layer 7. Thus, the device surrounding wall 5 is used as an extended heat dissipation structure, to facilitate increasing the heat dissipation area and improving the heat dissipation efficiency.

Taking the embedded packaging structure 100 shown in FIG. 1 as an example, the blocking wall 1 is provided on the outside of the first wiring layer 7 on the first surface 21, surrounds the working face opening 18 of the working face 17 of the optical communication device 3, and is extended a certain distance in a direction away from the first surface 21, to prevent the optical signal of the optical communication device 3 from external interference during transmission and also prevent mutual interference between the optical communication devices 3. The specific shape of the blocking wall 1 is not defined/limited. The blocking wall 1 may be made by a photosensitive resin material or a metal material, such as Cu. The photosensitive resin material may be selected from a polyimide photosensitive resin and a polyphenylene oxide/ether photosensitive resin, such as Microsystems HD-4100, Hitachi PVF-02, etc.

On the outside of the wiring layers 7, 8, it is possible to provide a welding resisting layer 19 and a metal protection layer 13. The metal protection layer 13 may include an organic solderability preservative (OSP) film or an electroless Ni electroless Pd immersion gold (ENEPIG), to prevent oxidation of the metal surface of the wiring layer.

It can be seen from the above description that the embedded packaging structure can achieve high-density integration of light emission and light reception, can achieve photoelectric communication between different packagings without mutual interference, and improves the signal quality of the signal transmission of the embedded packaging structure. In addition, it can increase heat dissipation area and improve heat dissipation efficiency, thus improving heat dissipation effect of the embedded packaging structure.

FIGS. 3a-3k show schematic diagrams of intermediate structures of various steps in a manufacturing method for the embedded packaging structure 100 shown in FIG. 1.

Figure 3A:
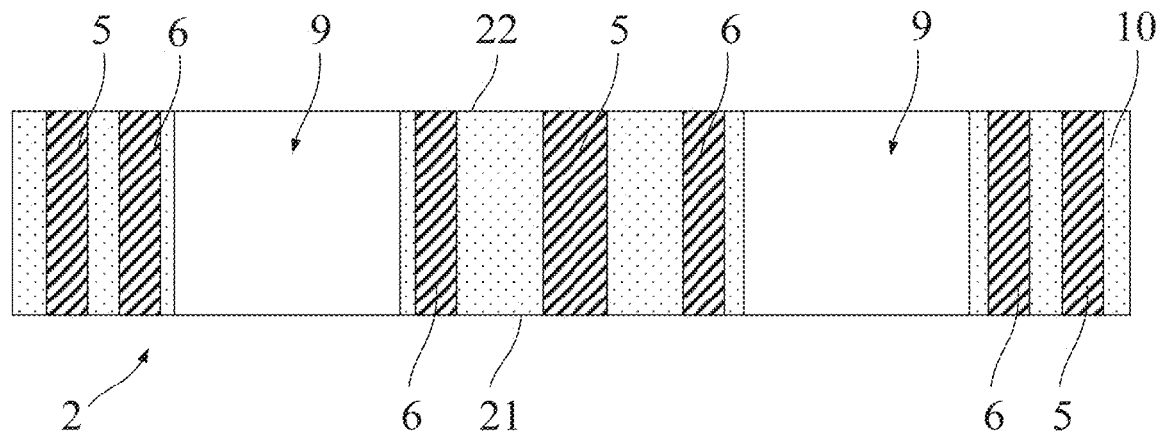
FIGS. 3a-3k are schematic diagrams of intermediate structures in a manufacturing process for an embedded packaging structure as provided in an embodiment of the present application.
Figure 3B:
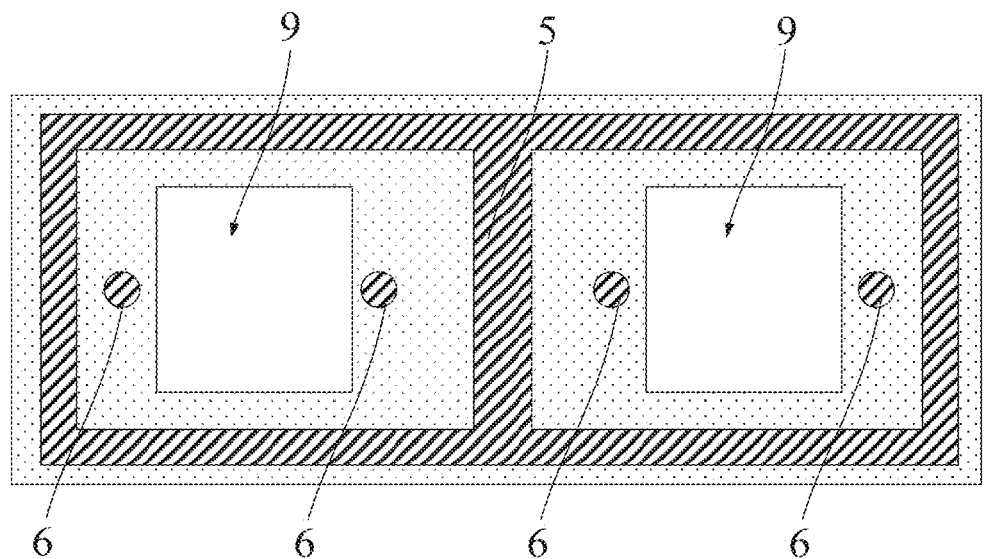

As shown in FIGS. 3a-3k, the manufacturing method for the embedded packaging structure 100 includes the following steps:

As shown in FIG. 3a and its top view of FIG. 3b, it is preparing a substrate 2 including a dielectric frame 10, wherein the substrate 2 includes a hollow cavity 9 surrounded by the frame 10 and a metal via-column 6 passing through a height of the frame 10 (step A). The substrate 2 may further include: a device surrounding wall 5 formed in the dielectric frame 10 and surrounding the hollow cavity 9. Alternatively, the device surrounding wall 5 may not be provided. The device surrounding wall 5 may surround one hollow cavity, or may surround multiple hollow cavities. The device surrounding wall 5 may function for electromagnetic shielding, to prevent the shielded device from electromagnetic interference.

Figure 3C:
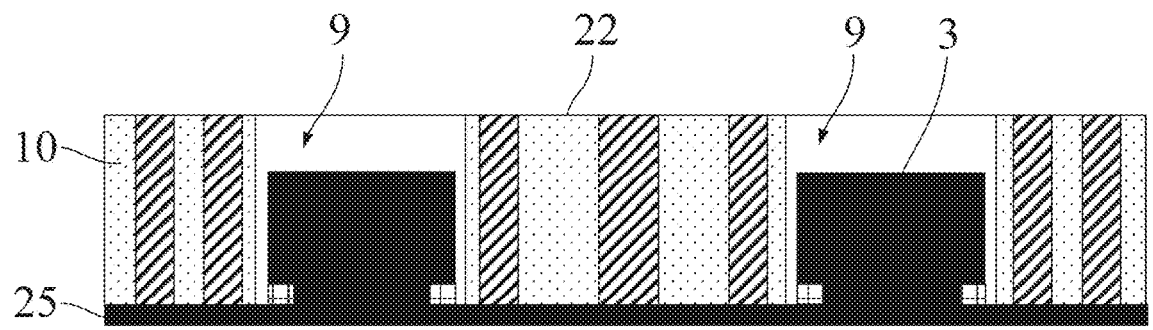

The next step (as shown in FIG. 3c) is placing a first surface 21 of the substrate 2 onto a bearing part 25 (step B). The bearing part 25 may be an adhesive tape (such as a photo-decomposing or thermo-decomposing adhesive tape), or may be a sacrificing Cu foil, a glass substrate or a Cu clad laminate (CCL) coated with a photo-decomposing or thermo-decomposing adhesive layer on the surface(s) thereof, such that the bearing part can be separated by heating or UV light radiation. The next step is placing an optical communication device 3 into the hollow cavity 9 of the substrate 2 surrounded by the frame 10, wherein the optical communication device 3 has a working face 17 surface-mounted onto the bearing part 25 (step C).

Figure 3D:
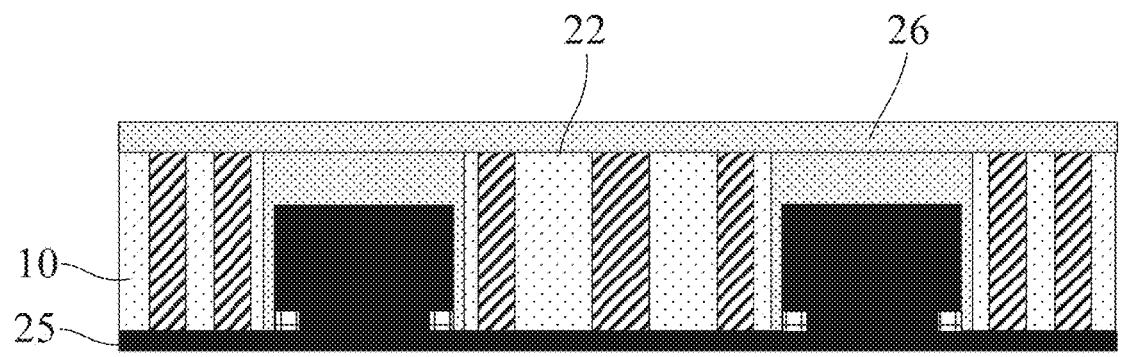

The next step (as shown in FIG. 3*d*) is laminating or coating a dielectric packaging material 26 onto a second surface 22 of the substrate 2 opposite to the first surface 21 to form an insulating layer 4 such that the dielectric packaging material fully fills a space between the optical communication device 3 and the frame (step D).

Figure 3E:
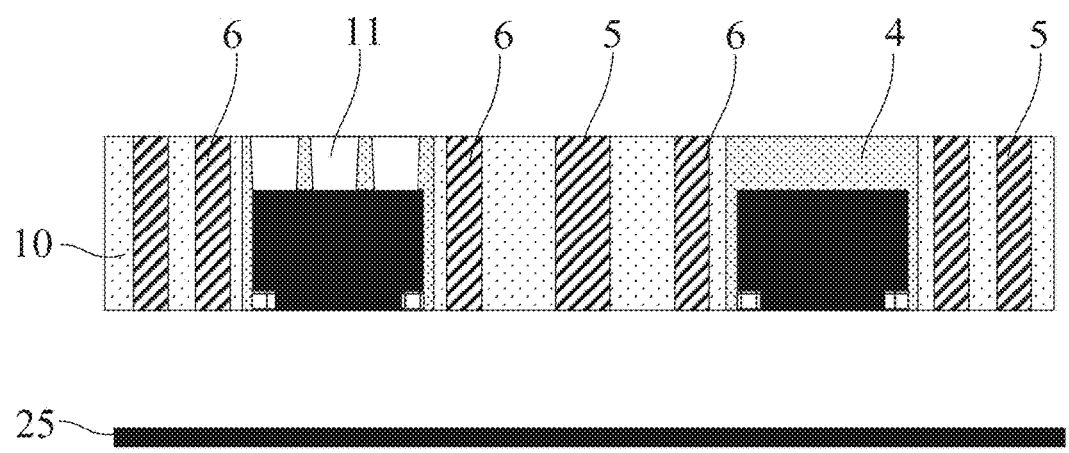

As shown in FIG. 3*e*, it is thinning the insulating layer 4 to reveal an end face of the metal via-column 6 on the second surface 22 (step E). It is possible to use a manner of plasma etching, plate grinding or polishing, etc. to thin the insulating layer 4. After the end face of the metal via-column 6 on the second surface 22 is revealed, it is possible to form a hole on a back face of the optical communication device 3 opposite to the working face 17 by a manner of laser hole-opening or lithography hole-opening to form the working face opening 18.

The next step is removing the bearing part 25, by UV light radiation or heating, to reveal the working face 17 of the optical communication device 3 and the end face of the metal via-column 6 on the first surface 21 (step F).

Figure 3F:
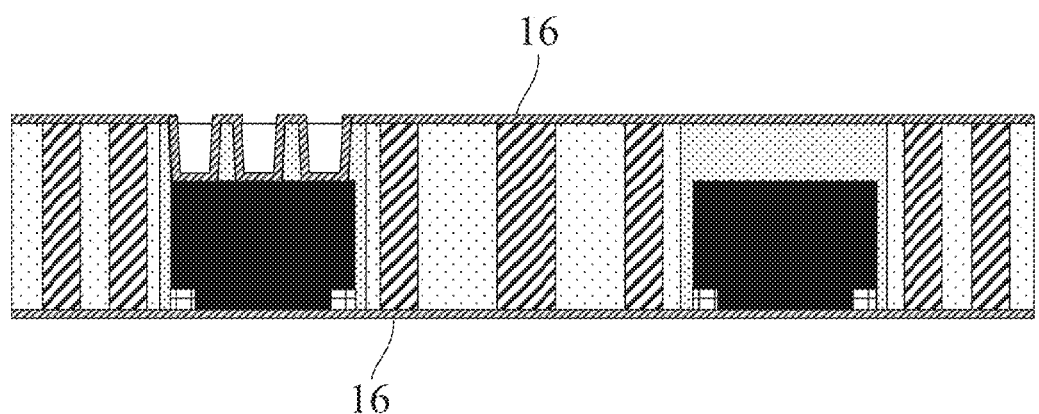

As shown in FIG. 3*f*, seed layers 16 are deposited on the first and second surfaces 21 and 22 of the substrate 2. The metal of the seed layer may be selected from Ti, Cu and Ti—W alloys, for example, but it is not limited thereto. The seed layer 16 may be formed by a manner of deposition, chemical/electroless plating or sputtering.

The next step is forming first and second wiring layers 7 and 8 on the first and second surfaces 21 and 22 of the substrate 2, respectively, wherein the first wiring layer 7 is formed thereon with a working face opening 18 to reveal the working face 17 of the optical communication device 3 from the first surface 21 (step G).

Figure 3G:
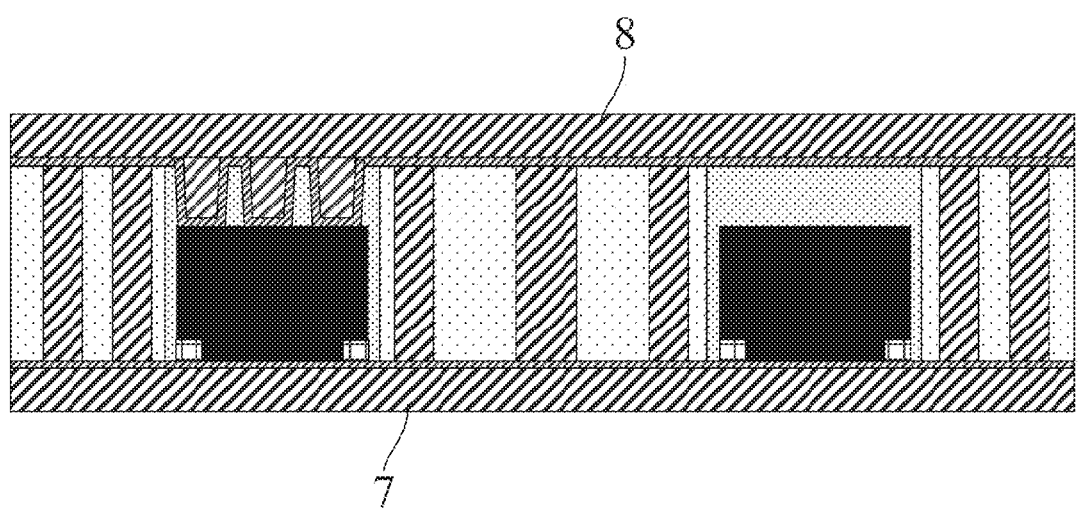
Figure 3H:
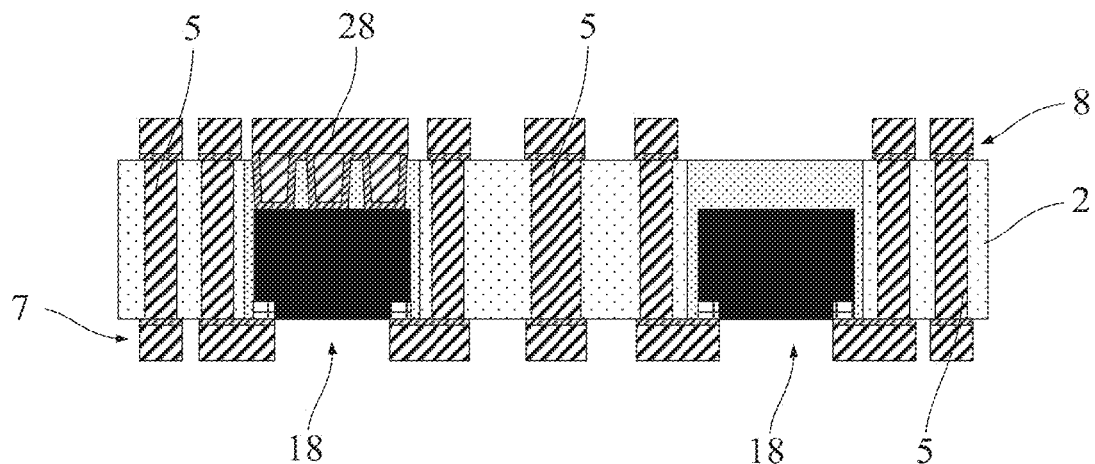

As shown in FIGS. 3*g* and 3*h*, the step G may include: depositing a metal layer 7 on the seed layer 16 (it is possible to use a manner of electroplating and hole-filling to form the metal layer 7 which preferably is a Cu layer); applying a photoresist on the metal layer 7, and performing exposure and development to form an etching resisting layer; and performing etching to the metal layer 7 and the seed layer 16, removing the etching resisting layer, and forming the first wiring layer 7 and the working face opening 18. The working face opening 18 reveals the working face 17 of the optical communication device 3, to allow the optical communication device 3 to emit light or receive light with respect to outside by the working face 17.

The step G may further includes applying a seed layer 16 on the second surface 22 of the substrate 2 which has revealed a back face of the optical communication device 3; applying a photoresist on the seed layer 16, and performing exposure and development to form a first pattern; and plating a metal in the first pattern and forming a second wiring layer 8 and a metal heat dissipation layer 28.

Figure 3I:
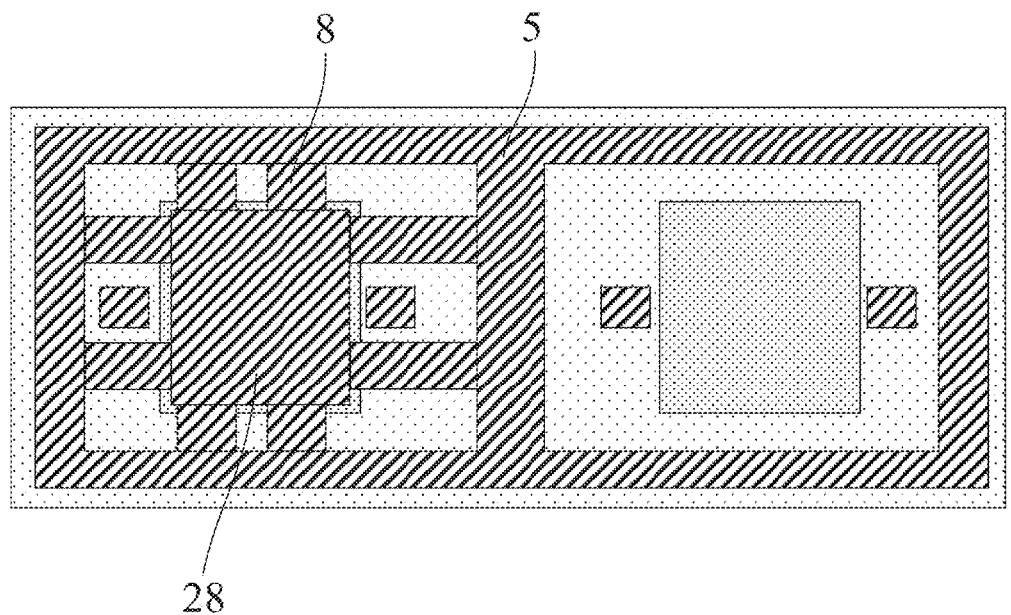

FIG. 3*i* is a top view of FIG. 3*h* seen in a direction from the second surface 22. As shown in FIG. 3*i*, in a preferred technical solution, a metal heat dissipation layer 28 is formed on a back face of the optical communication device 3 to facilitate conducting the heat produced by the optical communication device 3 to the outer surface of the packaging structure, effectively lowering the working temperature of the device. In addition, the metal heat dissipation layer 28 may be connected with the device surrounding wall 5 by the second wiring layer 8, thus forming a larger heat dissipation surface to further improve the heat dissipation efficiency.

Figure 3J:
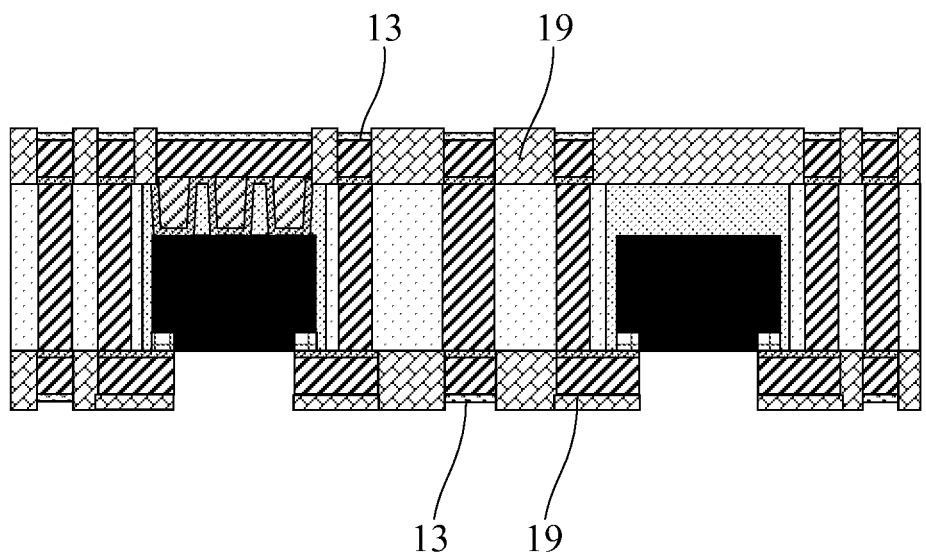

The next step (as shown in FIG. 3*j*) may be applying welding resisting layers 19 on the first and second wiring layers 7 and 8 of the substrate 2, and forming a revealed metal window. Alternatively, it is possible to perform layer building up on the first and second wiring layers 7 and 8 of the substrate 2 by a manner of further laminating an insulating layer and forming a wiring layer, to obtain a packaging structure having multiple layers of substrates. It should be noted that it is necessary to prevent the layer building up structure from blocking the working face opening 18. In addition, it is also possible to perform a metal surface processing to the revealed metal window to form a metal protection layer 13, which may include an organic solderability preservative (OSP) film or an electroless Ni electroless Pd immersion gold (ENEPIG), for example, to prevent oxidation of the metal surface of the wiring layer.

Figure 3K:
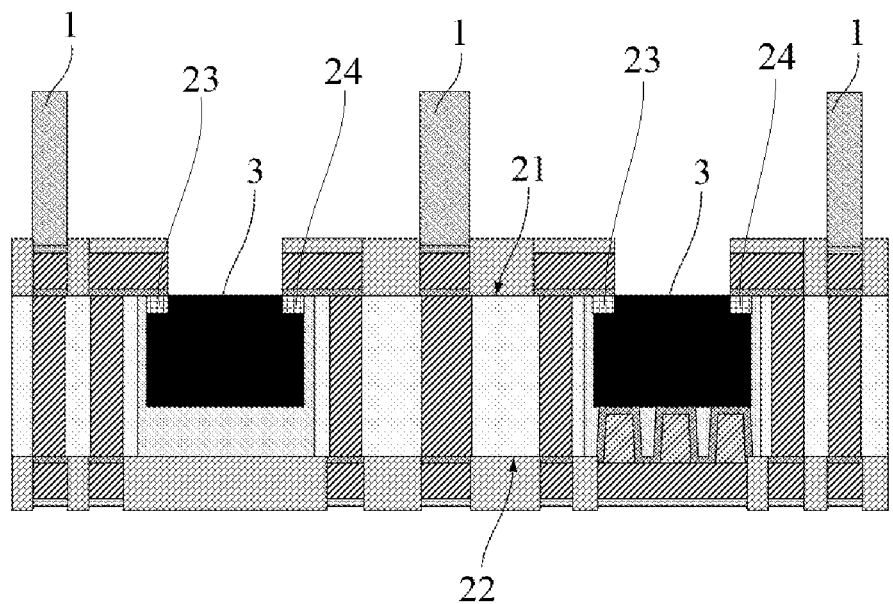

The next step (as shown in FIG. 3*k*) is: forming the blocking wall 1, surrounding the working face opening 18 of the working face 17 of the optical communication device 3, on the first surface 21 of the substrate 2, wherein the blocking wall extends beyond the first surface 21 in a direction away from the first surface 21 (step H). The step H may further include: applying a photosensitive resin material on the first surface 21 of the substrate 2; performing exposure and development, and curing the photosensitive resin material to form the blocking wall 1 surrounding the working face opening 18. In an alternative embodiment, the step H may further include: obtaining a prefabricated metal block, such as a Cu block; printing a welding material in a predetermined position of the first surface 21 of the substrate 2; surface-mounting the metal block onto the welding material; and forming the blocking wall 1 by reflow welding. In another alternative embodiment, the step H may further include: depositing a seed layer 16 on the first surface 21 of the substrate 2; applying a photoresist on the seed layer 16, and performing exposure and development to form a second pattern; plating a metal, such as Cu, in the second pattern to form the blocking wall 1; and removing the photoresist and performing etching to the seed layer 16.

The blocking wall 1 can prevent the optical signal(s) of the optical communication device 3 from external interference during transmission, and also can prevent mutual interference between the optical communication devices 3. The specific shape of the blocking wall 1 is not defined/limited.

In the description of the embodiments of the present application, it should be noted that the terms of "central", "upper", "lower", "left", "right", "vertical", "horizontal", "inner", "outer", etc., indicate an orientation or position relation with reference to that shown in the figures. They are used only to facilitate describing the present application and simplifying the description, rather than indicating or hinting that the indicated device or element should have a specific orientation or configure and operate in a specific orientation, and thus should not be understood as limitation to the present application. In addition, the terms of "first", "second" and "third" are used only for the purpose of description, and should not be understood as indicating or hinting a relative importance.

In the description of the embodiments of the present application, it should be noted that the terms of "mount", "interconnect" and "connect" should be understood in a broad sense, unless otherwise clearly specified and defined. For example, it may mean fixed connection, or removable connection, or integral connection. It may mean mechanical connection, or electrical connection. It may mean direct connection, or indirect connection by an intermediate portion. It may mean internal communication between two elements. For those skilled in the art, the specific meaning of the above term in an embodiment of the present application can be understood according to specific situation.

In addition, the technical features involved in the various embodiments of the present application as described above can be combined with one another as long as there is no contradiction therebetween.

As above, the technical solutions of the present application have been described in connection with the preferred embodiments as shown in the figures. However, it is easily understood by those skilled in the art that the protection scope of the present application is not limited to these specific embodiments. Those skilled in the art can make equivalent modification or substitution to the related technical feature(s) without departing from the principle of the present application. The technical solutions after the modification or substitution will fall within the protection scope of the present application.

What is claimed is:

1. A method for manufacturing an embedded packaging structure, the method comprising:
    A) preparing a substrate comprising a dielectric frame, wherein the substrate comprises a through hollow cavity surrounded by the frame and a metal via-column passing through a height of the frame, and forming a metal device blocking wall as an integrated electric conductor continuously surrounding the hollow cavity in the dielectric frame;
    B) placing a first surface of the substrate onto a bearing part;
    C) placing a first optical communication device into the hollow cavity of the substrate, wherein the first optical communication device has a working face surface-mounted onto the bearing part;
    D) laminating or coating a dielectric packaging material onto a second surface of the substrate opposite to the first surface to form an insulating layer such that the dielectric packaging material fully fills a space between the first optical communication device and the frame;
    E) thinning the insulating layer to reveal a first end face of the metal via-column on the second surface;
    F) removing the bearing part to reveal the working face of the first optical communication device and a second end face of the metal via-column on the first surface;
    G) forming first and second wiring layers on the first and second surfaces of the substrate, wherein the first wiring layer is formed thereon with a working face opening to reveal the working face of the first optical communication device from the first surface; and forming a metal heat dissipation layer on a device back face of the first optical communication device opposite to the working face, wherein the metal heat dissipation layer is connected with the device blocking wall by the second wiring layer; and
    H) forming a blocking wall by electroplating on the first surface of the substrate to form a continuous metal wall surrounding the working face of the first optical communication device, wherein the blocking wall extends from the metal device blocking wall to be higher than the working face of the first optical communication device and extends beyond the first wiring layer to prevent the first optical communication device from optical interfering with a second optical communication device.

2. The method according to claim 1, characterized in that the bearing part is selected from a thermo-decomposing or photo-decomposing adhesive tape, a sacrificing Cu foil, a glass carrying plate or a single-side Cu clad laminate coated on its surface with a thermo-decomposing or photo-decomposing adhesive.

3. The method according to claim 1, characterized in that the step G further comprises:
    applying a first seed layer on the first surface of the substrate;
    depositing a metal layer on the first seed layer;
    applying a photoresist on the metal layer, and performing exposure and development to form an etching resisting layer; and
    performing etching to the metal layer and the first seed layer, removing the etching resisting layer, and forming the first wiring layer and the working face opening.

4. The method according to claim 3, characterized in that the step G further comprises:
    revealing the device back face of the optical communication device on the second surface of the substrate;
    applying a second seed layer on the second surface of the substrate;
    applying a photoresist on the second seed layer, and performing exposure and development to form a first pattern; and
    plating a metal in the first pattern and forming the second wiring layer and a the metal heat dissipation layer.

5. The method according to claim 3, further comprising:
    after forming the first and second wiring layers, forming welding resisting layers on the first and second wiring layers.

6. The method according to claim 1, characterized in that the step G further comprises:
    revealing the device back face of the optical communication device on the second surface of the substrate;
    applying a second seed layer on the second surface of the substrate;
    applying a photoresist on the second seed layer, and performing exposure and development to form a first pattern; and
    plating a metal in the first pattern and forming the second wiring layer and a the metal heat dissipation layer, wherein the metal heat dissipation layer is connected, by the second wiring layer, with the device blocking wall.

7. The method according to claim 1, characterized in that the step H further comprises:
    depositing a third seed layer on the first surface of the substrate;
    applying a photoresist on the third seed layer, and performing exposure and development to form a second pattern;
    plating a metal in the second pattern to form the blocking wall; and
    removing the photoresist and performing etching to the third seed layer.

* * * * *